(12) United States Patent
Hu et al.

(10) Patent No.: US 10,689,751 B2
(45) Date of Patent: Jun. 23, 2020

(54) EVAPORATION SOURCE COVER, EVAPORATION SOURCE AND EVAPORATION APPARATUS

(71) Applicants: Boe Technology Group Co., Ltd., Beijing (CN); Hefei Xinsheng Optoelectronics Technology Co., Ltd., Hefei, Anhui (CN)

(72) Inventors: Changqi Hu, Beijing (CN); Shupeng Guo, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 364 days.

(21) Appl. No.: 15/855,879

(22) Filed: Dec. 27, 2017

(65) Prior Publication Data

US 2018/0258522 A1    Sep. 13, 2018

(30) Foreign Application Priority Data

Mar. 10, 2017    (CN) .................... 2017 2 0235275 U (51) Int. Cl.
*C23C 14/02* (2006.01)
*C23C 14/24* (2006.01)
*C23C 14/54* (2006.01)

(52) U.S. Cl.
CPC ............ *C23C 14/243* (2013.01); *C23C 14/54* (2013.01)

(58) Field of Classification Search
CPC .............................. C23C 14/54; C23C 14/243
See application file for complete search history.

(56) References Cited

U.S. PATENT DOCUMENTS

| | | | | |
|---|---|---|---|---|
| 6,899,797 | B2* | 5/2005 | Akram | C25F 7/00 |
| | | | | 204/202 |
| 7,651,926 | B2* | 1/2010 | Jacobson | B82Y 10/00 |
| | | | | 438/478 |
| 7,700,901 | B2* | 4/2010 | Busick | H05B 3/84 |
| | | | | 219/203 |
| 7,833,354 | B2* | 11/2010 | Kim | C23C 14/243 |
| | | | | 118/726 |
| 2013/0285061 | A1* | 10/2013 | Shukla | H01L 51/052 |
| | | | | 257/57 |
| 2014/0191190 | A1* | 7/2014 | Kim | H01L 33/325 |
| | | | | 257/13 |
| 2016/0111584 | A1* | 4/2016 | Chaudhari | C30B 19/00 |
| | | | | 438/71 |
| 2016/0293794 | A1* | 10/2016 | Nuzzo | H01L 23/02 |

* cited by examiner

*Primary Examiner* — Robert M Kunemund
(74) *Attorney, Agent, or Firm* — Womble Bond Dickinson (US) LLP (57) ABSTRACT

An evaporation source cover, an evaporation source and an evaporation apparatus are disclosed. The evaporation source cover comprises a cover body and an elastic dredging member which is arranged on the cover body. The elastic dredging member comprises a bottom part and a top part. The elastic dredging member is fixed to a surface of the cover body at the bottom part. The elastic dredging member is configured to extend and contract in a direction perpendicular to the surface of the cover body.

15 Claims, 5 Drawing Sheets

EVAPORATION SOURCE COVER, EVAPORATION SOURCE AND EVAPORATION APPARATUS

RELATED APPLICATIONS

The present application claims the benefit of Chinese Patent Application No. 201720235275.2, filed Mar. 10, 2017, the entire disclosure of which is incorporated herein by reference.

TECHNICAL FIELD

The present disclosure relates to the field of vacuum evaporation deposition, and particularly to an evaporation source cover, an evaporation source and an evaporation apparatus.

BACKGROUND

Vacuum evaporation deposition is a process in which substances to be deposited are heated in vacuum environment to evaporate or sublimate, to condensate or deposit on a surface of a low-temperature workpiece or substrate, so that a film is formed. After being heated, substances to be deposited evaporate or sublimate in an evaporation crucible, and are emitted through an evaporation hole over the evaporation crucible. While a substrate to be deposited passes an outlet of the evaporation hole at a constant speed, the evaporated substances are gradually cooled and the rate of evaporation is also gradually reduced after leaving the evaporation crucible, and finally a film is formed on the surface of the substrate to be deposited.

According to the number and the arrangement mode of evaporation holes, the evaporation source of the evaporation apparatus may be divided into a point evaporation source, a linear evaporation source and a planar evaporation source. As for the point evaporation source, there is only one evaporation hole over the evaporation crucible and the deposition area is one relatively small range which is centered at the evaporation hole. The point evaporation source is usually used for depositing a film with a relatively small size. As for the linear evaporation source, there are a plurality of evaporation holes which are arranged linearly over the evaporation crucible. When the substrate to be deposited is stationary, the area of the deposited film on the substrate to be deposited formed by the linear evaporation source has a shape of a straight line. As for the planar evaporation source, there are a plurality of evaporation holes which are arranged on a whole surface over the evaporation crucible, such that the area of the deposited film is a whole area corresponding to the evaporation holes arranged on the whole surface.

In addition, according to the setting angle of the evaporation hole over the evaporation crucible, the evaporation hole may be divided into a vertical evaporation hole and a tilted evaporation hole. Especially when multiple materials are applied for depositing a doped film, it is required to adjust a tilting direction of evaporation holes of evaporation crucibles for multiple materials, so that evaporation holes over evaporation crucibles of different materials are oriented to a same positon on the substrate to be deposited.

SUMMARY

In an aspect, embodiments of the present disclosure provide an evaporation source cover, comprising a cover body and an elastic dredging member which is arranged on the cover body. The elastic dredging member comprises a bottom part and a top part. The elastic dredging member is fixed to a surface of the cover body at the bottom part. The elastic dredging member is configured to extend and contract in a direction perpendicular to the surface of the cover body.

For example, the elastic dredging member has a truncated cone shape, and has a cross-sectional diameter at the top part smaller than a cross-sectional diameter at the bottom part.

Further, the elastic dredging member is provided with a protective jacket which is arranged on an end close to the cover body.

For example, the protective jacket is fixed on the surface of the cover body.

For example, the elastic dredging member is a spiral spring.

In another aspect, embodiments of the present disclosure provide an evaporation source, comprising an evaporation crucible, an evaporation hole which is arranged on an outlet side of the evaporation crucible, and an evaporation source cover. The dredging member comprises a bottom part and a top part. The elastic dredging member is fixed to a surface of the cover body at the bottom part. The elastic dredging member is configured to extend and contract in a direction perpendicular to the surface of the cover body. The elastic dredging member has a cross-sectional shape which matches that of the evaporation hole, so that when the evaporation hole is covered by the evaporation source cover, the elastic dredging member at least partially extends into the evaporation hole.

For example, the elastic dredging member has a truncated cone shape, and has a cross-sectional diameter at the top part smaller than a cross-sectional diameter at the bottom part.

For example, the elastic dredging member is provided with a protective jacket which is arranged on an end close to the cover body.

For example, the protective jacket is fixed on the surface of the cover body.

For example, one end of the evaporation source cover is hingedly fixed on a side of the evaporation hole along a hinge axis, and the other end is turntable and covers the evaporation hole in a vertical manner.

Further, the hinge axis is perpendicular to an axis of the evaporation hole, and the elastic dredging member and the evaporation hole are arranged in a one-to-one corresponding manner.

Further, the evaporation hole is provided with a heat conducting element, the heat conducting element surrounds a periphery of the evaporation hole, and the heat conducting element may generate and conduct heat in an energized state.

Further, the evaporation source comprises a controller, which is electrically connected with the heat conducting element for turning on or off a power supply of the heat conducting element.

For example, the heat conducting element is provided with a thermal insulating layer on an outer side.

In yet another aspect, embodiments of the present disclosure provide an evaporation apparatus, comprising the evaporation source as described above.

BRIEF DESCRIPTION OF THE DRAWINGS

For explaining the technical solutions in embodiments of the present disclosure more clearly, drawings need to be used in the description of embodiments are simply intro

DETAILED DESCRIPTION OF EMBODIMENTS

Technical solutions of embodiments of this disclosure will be described hereinafter in more details and more completely with reference to the accompanying drawings of embodiments of this disclosure. Apparently, the embodiments described are only some embodiments of this disclosure rather than all embodiments. Based on embodiments of this disclosure, all the other embodiments by the person with ordinary skills in the art without undue experimentation should be covered within the protection scope of this disclosure.

Reference numerals: 00-evaporation source cover; 10-cover body; 20-elastic dredging member; 21-protective jacket; 30-evaporation crucible; 31-evaporation hole; 40-hinge axis; 50-heat conducting element; 60-controller; 70-thermal insulting layer; α-axis of evaporation hole; h1-cross-sectional diameter of top part of elastic dredging member; h2-cross-sectional diameter of bottom part of elastic dredging member.

Inventors have found that, the evaporated substances to be deposited start to gradually cool down upon leaving the evaporation crucible and entering the evaporation hole. Some of the substances may be deposited on an inner wall of the evaporation hole when passing through the evaporation hole. The gradual increase of the substances which are deposited on the inner wall of the evaporation hole will reduce an inside passage of the evaporation hole. This causes a change in a deposition range of the evaporation hole, and even completely clogs the evaporation hole. Furthermore, a thickness of the deposited film will be non-uniform, which influences a light emitting efficiency and a lifetime of device.

A rigid bar is usually used to insert into the evaporation hole for dredging in case the evaporation hole is clogged. However, the rigid bar easily collides with the inner wall of the evaporation hole when the rigid bar is inserted into the evaporation hole, which would damage the inner wall of the evaporation hole. Especially for the tilted evaporation hole, there is a certain tilted angle inside the hole and it's difficult for the rigid bar to be completely inserted. As a result, the inner wall of the tilted evaporation hole is difficult to be cleaned and dredged efficiently.

Inventors have realized that there is a need for an evaporation source cover, an evaporation source and an evaporation apparatus in the art, which could solve the problem that the clogged evaporation hole is not easy to be cleaned and dredged after being clogged during evaporation.

Figure 1:
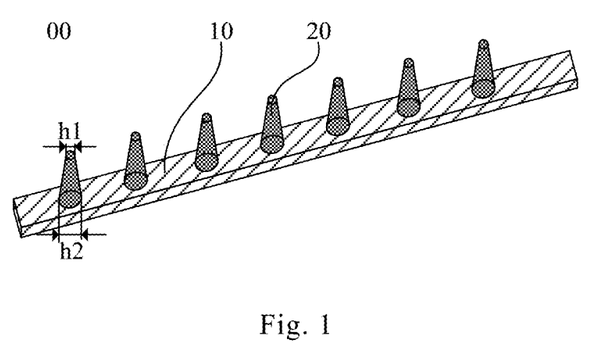
- FIG. 1 is a structural diagram of an evaporation source cover in an embodiment of the present disclosure.

Embodiments of the present disclosure provide an evaporation source cover. As shown in FIG. 1, the evaporation source cover 00 comprises a cover body 10 and an elastic dredging member 20 which is arranged on the cover body. The elastic dredging member 20 is fixed to a surface of the cover body 10 in a vertical manner along its extension and contraction direction. The elastic dredging member 20 has a truncated cone shape. For example, a cross-sectional diameter h1 of the top part of the elastic dredging member 20 is smaller than a cross-sectional diameter h2 of the bottom part.

In embodiment of the present disclosure, the elastic dredging member 20 is an element made from an elastic material. The elastic dredging member 20 may contract along the direction of pressure when under pressure, and may recover its compressed part after the pressure is removed. The extension and contraction direction of the elastic dredging member 20 is the direction along which a pressure is applied to the elastic dredging member 20 and the pressure is removed. The elastic dredging member 20 is fixed to the surface of the cover body 10 in a vertical manner along the extension and contraction direction. Based on this, when the elastic dredging member 20 is under pressure along the direction perpendicular to the surface of the cover body 10, the size of the elastic dredging member 20 along the direction perpendicular to the cover body 10 may generate compression under pressure, and may recover its size after the pressure is removed.

As shown in FIG. 1, the elastic dredging member 20 has a truncated cone shape and the cross-sectional diameter h1 of the top part is smaller than the cross-sectional diameter h2 of the bottom part. That is to say, when the elastic dredging member 20 is securely mounted on the cover body 10, an end with a larger cross-sectional diameter is securely connected to the cover body 10 and an end with a smaller cross-sectional diameter is on the top, which is used to be inserted into the evaporation hole when the evaporation hole is being cleaned and dredged. The cross-sectional diameter h1 of the top part of the elastic dredging member 20 is relatively small, reducing the risk of colliding with the opening of the evaporation hole when the elastic dredging member 20 is inserted into the evaporation hole.

An embodiment of the present disclosure provides an evaporation source cover, including a cover body and an elastic dredging member on the cover body. The elastic dredging member is fixed to the surface of the cover body in a vertical manner along the extension and contraction direction. The elastic dredging member has a truncated cone shape. The cross-sectional diameter of the top part of the elastic dredging member is smaller than the cross-sectional diameter of the bottom part. By covering the evaporation source cover over the evaporation hole of the evaporation source, the elastic dredging member on the cover body may perpendicularly insert into the evaporation hole to physically remove the substances to be deposited which are deposited on the inner wall of the evaporation hole. At the same time, the elastic dredging member has scalability. When the elastic dredging member contacts the opening of the evaporation hole and rubs with the inner wall of the evaporation hole, the elastic dredging member may elastically be compressed to reduce the collision damage to the opening and the inner wall of the evaporation hole and to increase the lifetime of the evaporation hole.

Figure 2:
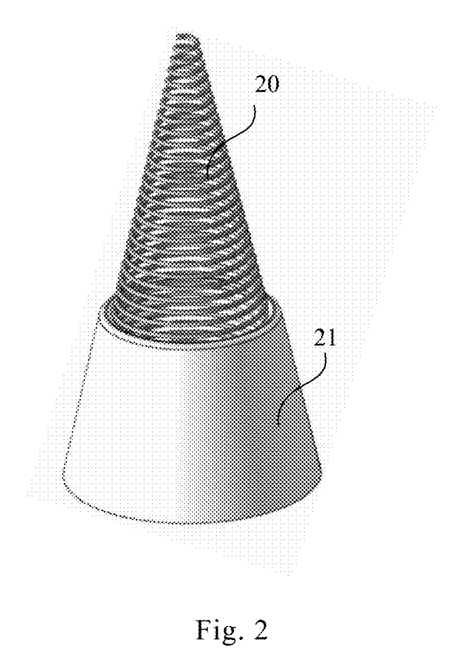
FIG. 2 is a structural diagram of an evaporation source cover in an embodiment of the present disclosure, in which an elastic dredging member is provided with a protective jacket.

Further, as shown in FIG. 2, a protective jacket 21 is arranged on the bottom part of the elastic dredging member 20.

After the elastic dredging member 20 is securely connected to the cover body 10, the protective jacket 21 is arranged on the elastic dredging member 20. The protective jacket 21 is also securely connected to the cover body 10. In this way, on one hand, the protective jacket 21 may increase the stability of the secure connection between the elastic dredging member 20 and the cover body 10, reducing the risk that the elastic dredging member 20 moves on the cover body 10 and causes collision to the opening of the evaporation hole when the evaporation hole is being dredging and cleaning. On the other hand, after the evaporation hole is dredged and cleaned by the evaporation source cover, the evaporation material particles cleaned from the inner wall of the evaporation holes may be collected in the protective jacket 21, reducing the falling the evaporation material to the evaporation crucible.

In embodiments of the present disclosure, the elastic dredging member 20 and the protective jacket 21 which is arranged on the bottom part of the elastic dredging member 20 are both sand blasted. As a result, when the evaporation material on the inner wall of the evaporation hole 31 are being removed, the removed evaporation materials are adhered to the elastic dredging member 20 and the protective jacket 21, and collected in the protective jacket 21.

For example, as shown in FIG. 2, the elastic dredging member 20 is a spiral spring.

As shown in FIG. 2, the spiral spring is heat resistant and can be used repeatedly. It has a long lifetime and a high stability. The manufacturing process for the spiral spring is mature. Based on the actual use requirements, the size range, elastic range designed and winding number of the spiral spring may be particularly designed and manufactured so as to be suitable for the size and strength of the evaporation holes on different evaporation sources.

Figure 3:
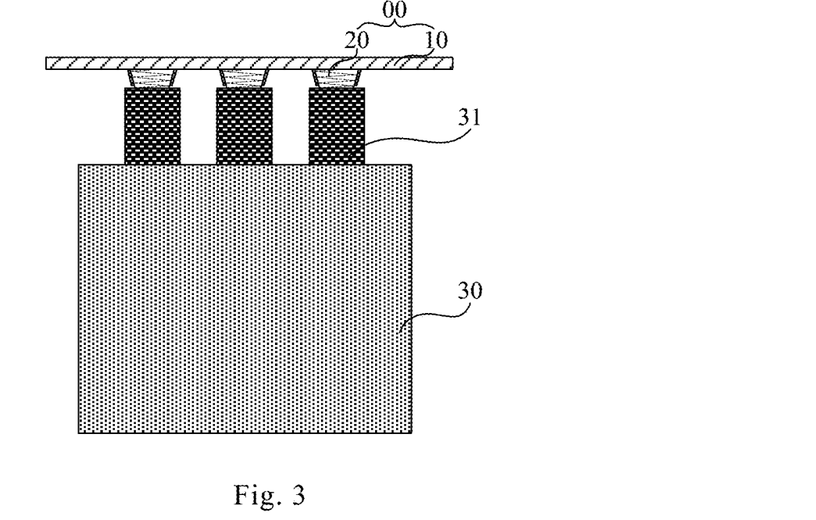
FIG. 3 is a structural diagram of an evaporation source in an embodiment of the present disclosure.

In another aspect, embodiments of the present disclosure provide an evaporation source. As shown in FIG. 3, the evaporation source comprises an evaporation crucible 30 and the evaporation hole 31 which is arranged at the outlet side of the evaporation crucible 30. The evaporation source further comprises the evaporation source cover 00. The elastic dredging member 20 may be at least partially inserted into the evaporation hole 31 when the evaporation hole 31 is covered by the evaporation source cover 00.

The evaporation materials are heated in the evaporation crucible 30 to evaporate outward in a gaseous form through the evaporation hole 31 at the outlet side of the evaporation crucible 30. Because the evaporation materials have left the heating region of the evaporation crucible 30 when the evaporation materials are passing through the evaporation hole 31, the evaporation materials start to gradually cool down. In the temperature falling period of the evaporation materials, some of the evaporation materials are attached to the inner wall of the evaporation hole 31 due to deposition at a lower temperature. When there are too many evaporation materials on the inner wall of the evaporation hole 31, the channel space in the evaporation hole 31 for allowing the evaporation materials to pass through is occupied. This influences the deposition rate of the evaporation materials which are jet from the evaporation hole 31. More seriously, the evaporation hole 31 may even be clogged so that the evaporation materials are completely blocked and cannot be jetted. When too many evaporation materials are deposited on the inner wall of the evaporation hole 31, the evaporation source cover 00 is caused to cover the evaporation hole 31, so that the elastic dredging member 20 is at least partially inserted into the evaporation hole 31. In this way, the elastic dredging member 20 inserted into the evaporation hole 31 may clean the evaporation materials of the inner wall of the evaporation hole 31. Because the elastic dredging member 20 is elastic itself, it may compress in size in some degrees under pressure to buffer the force generated in the collision process, reducing collision damage for the evaporation hole 31 due to the collision between the elastic dredging member 20 and the opening or the inner wall of the evaporation hole 31 when the evaporation hole 31 is being cleaned.

It is noted that in embodiments of the present disclosure, the elastic dredging member 20 is at least partially inserted into the evaporation hole 31 to clean the inner wall of the evaporation hole 31. Therefore, for example, the elastic dredging member 20 has a cross-sectional shape which correspondingly matches that of the evaporation hole 31 to be dredged and cleaned. Herein the cross-sectional shape of the elastic dredging member and the evaporation hole refers to a cross-sectional shape of the elastic dredging member and the evaporation hole in a plane parallel to the surface of the cover body.

For example, the diameter h1 of the top part of the truncated-cone-shaped elastic dredging member 20 is less than or equal to ½ of the aperture of the evaporation hole 31 so as to further reduce the possibility of collision damage to the opening of the evaporation hole 21 when the elastic dredging member 20 is inserted into the evaporation hole 31.

Further, when the protective jacket 21 is arranged outside the elastic dredging member 20, the length of the elastic dredging member 20 exposed from the protective jacket 21 is set to be between ⅓ and ½ of the height of the evaporation hole 31.

If the length of the elastic dredging member 20 exposed from the protective jacket 21 is less than ⅓ of the height of the evaporation hole 31, the elastic dredging member 20 has poor cleaning ability on the inner wall of the evaporation hole 31 and it is difficult to clean the inner wall of the end of the evaporation hole 31 close to the evaporation crucible 30. If the length of the elastic dredging member 20 exposed from the protective jacket 21 is more than ½ of the height of the evaporation hole 31, it is easy to scratch the interior of the evaporation hole 31 when the elastic dredging member 20 is inserted into the evaporation hole 31.

Figure 4:
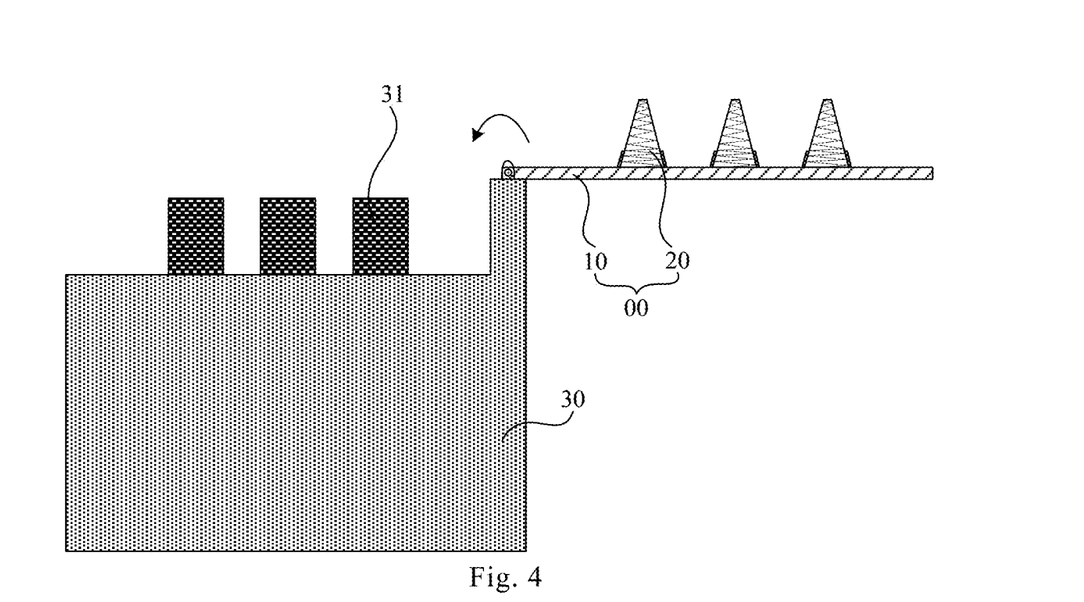
FIG. 4 is a structural diagram of a hinged connection between an evaporation source cover and an evaporation crucible in an evaporation source in an embodiment of the present disclosure.

For example, as shown in FIG. 4, one end of the evaporation source cover 00 is hingedly fixed on a side of the evaporation hole 31 along a hinge axis, and the other end can be turntable and covers the evaporation hole 31 in a vertical manner.

In this way, on one hand, the evaporation source cover 00 is connected to the evaporation crucible 30 to avoid using the evaporation source cover 00 alone each time when the evaporation hole 31 needs to be cleaned, reducing the number of separate components in the entire evaporation apparatus and reducing the possibility of the missing and damage of the components. On the other hand, when the evaporation source cover 00 that is hingely fixed to the evaporation crucible 30 is securely mounted, the elastic dredging member 20 on the evaporation source cover 00 corresponds in position with the evaporation hole 31 and this corresponding relationship is fixed. Each time the evaporation source cover 00 is used to clean the evaporation hole 31, the evaporation source cover 00 can be just rotated in the direction shown by an arrow in FIG. 4 around the hinging positon. The elastic dredging member 20 on the evaporation source cover 00 may be inserted into the corresponding evaporation hole 31, and there is no need to match the elastic dredging member 20 and the evaporation hole 31 each time the evaporation source cover 00 is used to clean the evaporation hole 31. This saves the operating time and reduces the risk of misalignment and collision between the elastic dredging member 20 and the evaporation hole 31.

Figure 5A:
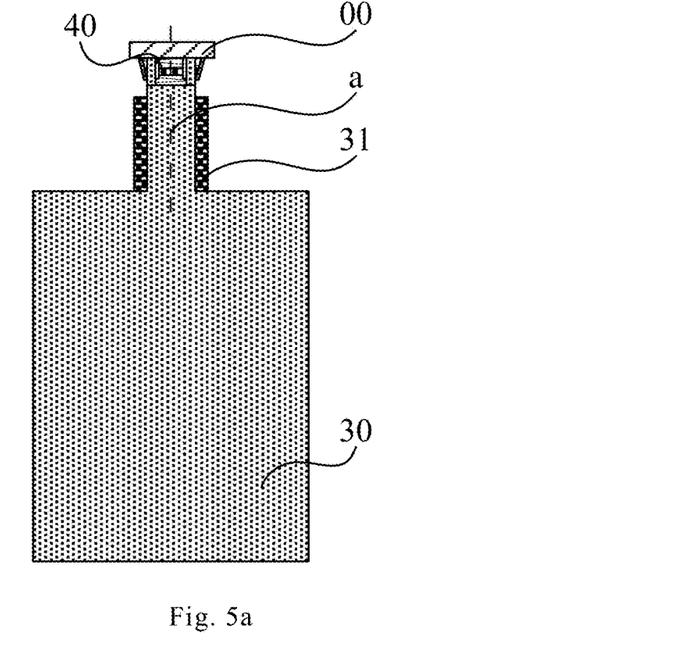
FIG. 5a is a right view of the evaporation source shown in FIG. 4.
Figure 5B:
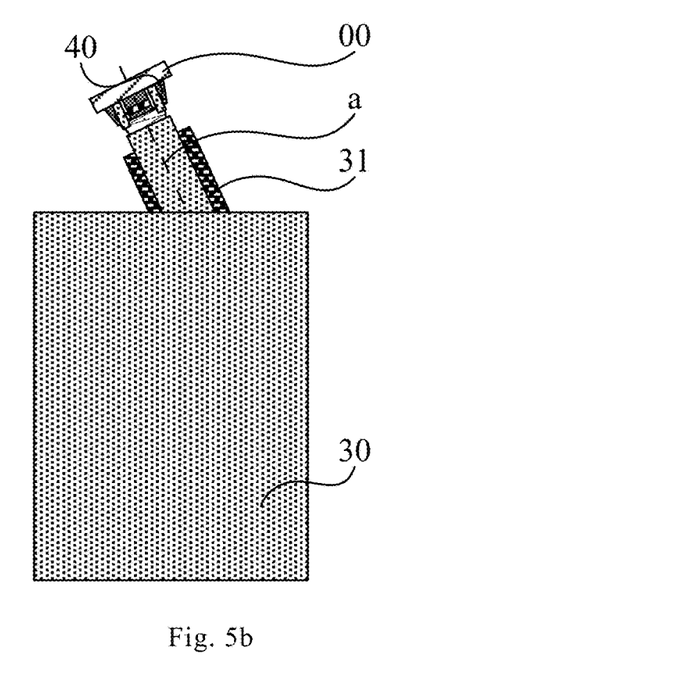
FIG. 5b is another right view of the evaporation source shown in FIG. 4.
Figure 5C:
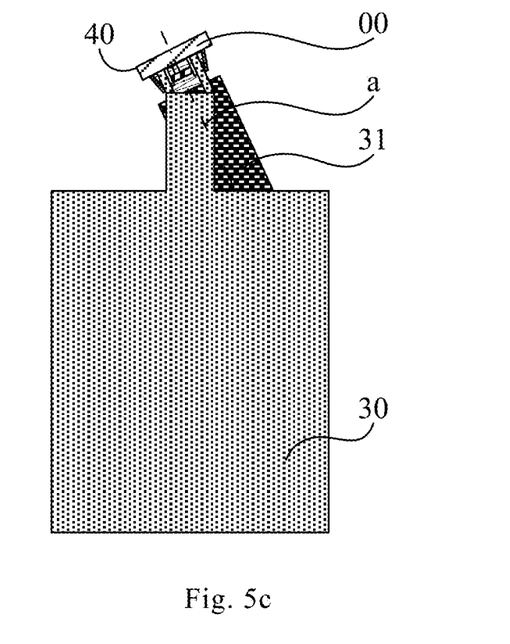
FIG. 5c is yet another right view of the evaporation source shown in FIG. 4.

Further, as shown in FIGS. 5*a*-5*c*, the hinge axis 40 is perpendicular to an axis α of the evaporation hole 31. Moreover, as shown in FIG. 4, the elastic dredging member 20 and the evaporation hole 31 are arranged in a one-to-one corresponding manner.

The evaporation holes 31 over the evaporation crucible 30 can be divided into two types according to the setting angle and method, i.e., vertical evaporation holes (as shown in FIG. 5*a*) and tilted evaporation holes (as shown in FIG. 5*b* and FIG. 5*c*). They are chosen according to deposition thickness on the substrates to be deposited.

As shown in FIG. 5*a*, the evaporation hole 31 on the evaporation crucible 30 is a vertical evaporation hole. The evaporation source cover 00 is connected to the evaporation crucible 30 through the hinge axis 40 at the hinge position. The hinge axis 40 is perpendicular to an axis α of the evaporation hole 31. The evaporation source cover 00 is rotated in a plane where the axis α is located to cover the evaporation hole 31 and clean the inner wall of the evaporation hole 31. When the evaporation hole 31 on the evaporation crucible 30 is a tilted evaporation hole, as shown in FIG. 5*b* or FIG. 5*c*, the tilted angle of the hinge axis 40 is the same as the tilted angle of the tilted evaporation hole, so that the hinge axis 40 and the axis of the evaporation hole 31 are perpendicular to each other. When the evaporation source cover 00 covers the evaporation hole 31, the elastic dredging member 20 is perpendicularly inserted into the evaporation hole 31. This reduces the risk of the elastic dredging member 20 colliding with the opening of the evaporation hole 31.

Figure 6:
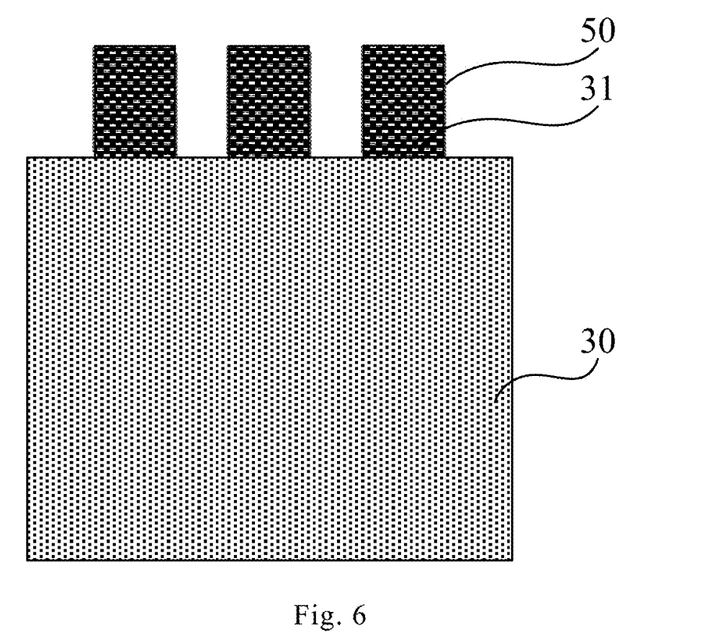
FIG. 6 is a structural diagram of an evaporation source in an embodiment of the present disclosure in which a heat conducting element is arranged on a periphery of an evaporation hole.

Further, as shown in FIG. 6, a heat conducting element 50 is arranged on the evaporation hole 31. The heat conducting element 50 is arranged to surround the periphery of the evaporation hole 31. The heat conducting element 50 may generate and conduct heat in an energized state.

As shown in FIG. 6, the heat conducting element 50 is arranged to surround the evaporation hole 31 on the periphery of the evaporation hole 31. When being energized, the heat conducting element 50 generates heat and conducts heat to the periphery of the evaporation hole 31, so that the outer periphery of the evaporation hole 31 is kept at a temperature higher than a temperature inside the evaporation crucible 30. The cooling down and deposition of the evaporation materials in the evaporation crucible 30 on the inner wall of the evaporation hole 31 are reduced. The particular material and the shape of the heat conducting element 50 in embodiments of the present disclosure are not particularly limited. Any material capable of generating heat in an energized state and conducting the heat to the periphery of the evaporation hole 31 to increase the heat for the evaporation hole 31 can be adopted. For example, as shown in FIG. 6, the heat conducting element 50 may be a heating wire which is wound around the outer periphery of the evaporation hole 31. When the heating wire is in an energized state, the heating wire generates heat and heats the evaporation hole 31 due to its large resistance.

For example, a setting height of the heat conducting element 50 on the evaporation hole 31 is slightly lower than the height of the evaporation hole 31, so that the heat conducting element 50 is capable of heating the evaporation hole 31, and at the same time it is possible to avoid the evaporation source cover 00 from colliding the elastic dredging member 20 during cleaning the evaporation hole 31.

Figure 7:
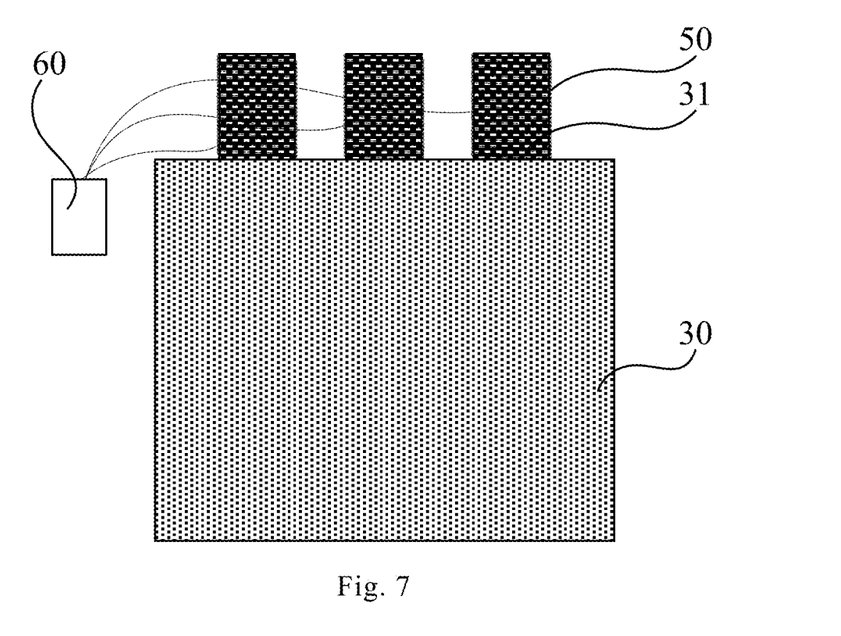
FIG. 7 is a structural diagram of an evaporation source with a controller in an embodiment of the present disclosure.

Further, as shown in FIG. 7, a controller 60 is also included. The controller 60 is electrically connected with the heat conducting element 50 for turning on or off a power supply of the heat conducting element 50.

In this way, the controller 60 can control the power on/off of the heat conducting element 50. On one hand, the amount of heat of the heat conducting element 50 can be controlled by the controller 60 to increase an automation degree of the apparatus. On the other hand, by setting and connection of the controller 60 and the heat conducting element 50, the heat conducting element 50 on the evaporation holes 31 and the amount of heat during the power on state can be individually controlled to control the temperature at the periphery of each of the evaporation holes 31. This radically reduces the quantity of materials deposited on the inner wall of the evaporation hole 31.

Figure 8:
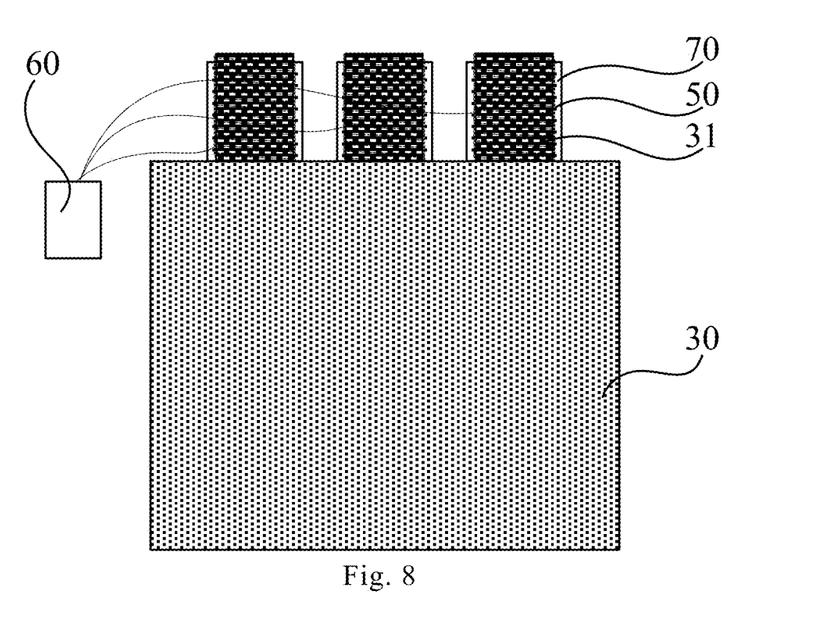
FIG. 8 is a structural diagram of an evaporation source in an embodiment of the present disclosure in which a thermal insulting layer is arranged on a thermal insulting layer.

For example, as shown in FIG. 8, a thermal insulting layer 70 is arranged on an outer side of the heat conducting element 50.

As shown in FIG. 8, when the heat conducting element 50 is heating, the heat generated by it heats the evaporation hole 31. At the same time, some heat is dissipated into the air to cause heat loss. By arranging the thermal insulating layer 70 on the outside of the heat conducting element 50, the dissipation of the heat generated by the heat conducting element 50 may be reduced, so as to reduce the heat loss. This reduces the power consumption and saves the power to the heat conducting element 50.

For example, a setting height of the thermal insulating layer 70 is same as the height of the evaporation hole 31, so as to increase the thermal insulation capacity as much as possible. At the same time, it is possible to avoid damage to the elastic dredging member 20 due to collision when the thermal insulating layer 70 is higher than the opening of the evaporation hole 31.

In yet another aspect, embodiments of the present disclosure provide an evaporation apparatus, including the evaporation source described above.

When the substrate to be deposited is deposited by the evaporation apparatus according to embodiments of the present disclosure, the evaporation crucible 30 is firstly heated so that the evaporation materials in the evaporation crucible 30 are heated to evaporate, and the evaporation materials in the vapor phase evaporate through the evaporation hole 31 on the outlet side of the evaporation crucible 30. The substrate to be deposited is arranged over the corresponding evaporation hole 31, and the evaporated evaporation materials are cooled down and deposited on the substrate to be deposited to form a film. The heat conducting element 50 is arranged on the outer periphery of the evaporation hole 31. The heat conducting element 50 generates heat in an energized state and the evaporation hole 31 is heated to reduce deposition of the evaporation materials on the inner wall of the evaporation hole 31 when the evaporation materials pass through the evaporation hole 31. A heat insulating layer 70 is arranged on the outer side of the heat conducting element 50 to reduce dissipation loss of heat generated by the heat conducting element 50 and increase the heating efficiency of the heat conducting element 50. When a relatively large amount of evaporation materials are deposited on the inner wall of the evaporation hole 31, the evaporation source cover 00 covers the evaporation hole 31, so that the elastic dredging member 20 is inserted into the corresponding evaporation hole 31 to clean the evaporation materials deposited on the inner wall of the evaporation hole 31.

In the foregoing description of the evaporation source cover 00 and the evaporation source, the evaporation process of the evaporation apparatus has been described in detail, and thus is not described herein again.

The foregoing descriptions are merely specific embodiments of the present disclosure, but the protection scope of the present disclosure is not limited thereto. Any variations and substitutions that person with ordinary skills in the art may easily conceive within the technical scope disclosed in the present disclosure should be covered within the protection scope of the present disclosure. Therefore, the protection scope of the present disclosure should be subject to the protection scope of the claims.

What is claimed is:

1. An evaporation source cover, comprising a cover body and an elastic dredging member which is arranged on the cover body,
    wherein the elastic dredging member comprises a bottom part and a top part, the elastic dredging member is fixed to a surface of the cover body at the bottom part, and the elastic dredging member is configured to extend and contract in a direction perpendicular to the surface of the cover body.

2. The evaporation source cover of claim 1, wherein the elastic dredging member has a truncated cone shape, and has a cross-sectional diameter at the top part smaller than a cross-sectional diameter at the bottom part.

3. The evaporation source cover of claim 1, wherein the elastic dredging member is provided with a protective jacket at an end close to the cover body.

4. The evaporation source cover of claim 3, wherein the protective jacket is fixed on the surface of the cover body.

5. The evaporation source cover of claim 1, wherein the elastic dredging member is a spiral spring.

6. An evaporation source, comprising an evaporation crucible, an evaporation hole which is arranged on an outlet side of the evaporation crucible, and an evaporation source cover,
    wherein the evaporation source cover comprises a cover body and an elastic dredging member which is arranged on the cover body,
    wherein the elastic dredging member comprises a bottom part and a top part, the elastic dredging member is fixed to a surface of the cover body at the bottom part, and the elastic dredging member is configured to extend and contract in a direction perpendicular to the surface of the cover body, and
    wherein the elastic dredging member has a cross-sectional shape which matches that of the evaporation hole, so that when the evaporation hole is covered by the evaporation source cover, the elastic dredging member at least partially extends into the evaporation hole.

7. The evaporation source of claim 6, wherein the elastic dredging member has a truncated cone shape, and has a cross-sectional diameter at the top part smaller than a cross-sectional diameter at the bottom part.

8. The evaporation source of claim 6, wherein the elastic dredging member is provided with a protective jacket which is arranged on an end close to the cover body.

9. The evaporation source of claim 8, wherein the protective jacket is fixed on the surface of the cover body.

10. The evaporation source of claim 6, wherein one end of the evaporation source cover is hingedly fixed on a side of the evaporation hole along a hinge axis, and the other end of the evaporation source cover is turntable and covers the evaporation hole in a vertical manner.

11. The evaporation source of claim 10, wherein the hinge axis is perpendicular to an axis of the evaporation hole, and the elastic dredging member and the evaporation hole are arranged in a one-to-one corresponding manner.

12. The evaporation source of claim 6, wherein the evaporation hole is provided with a heat conducting element, the heat conducting element surrounds a periphery of the evaporation hole, and the heat conducting element may generate and conduct heat in an energized state.

13. The evaporation source of claim 12, further comprising a controller, which is electrically connected with the heat conducting element for turning on or off a power supply of the heat conducting element.

14. The evaporation source of claim 12, wherein the heat conducting element is provided with a thermal insulating layer on an outer side.

15. An evaporation apparatus, comprising the evaporation source of claim 6.

* * * * *